United States Patent [19]

Sears

[11] Patent Number: 4,463,354

[45] Date of Patent: Jul. 31, 1984

[54] APPARATUS FOR COMMUNICATING UTILITY USAGE RELATED INFORMATION FROM A UTILITY USAGE LOCATION TO A PORTABLE UTILITY USAGE REGISTERING DEVICE

[76] Inventor: Lawrence M. Sears, 23945 Merchantile, Cleveland, Ohio 44122

[21] Appl. No.: 328,950

[22] Filed: Dec. 9, 1981

[51] Int. Cl.$^3$ .................... G08C 19/00; G01D 9/00
[52] U.S. Cl. ................ 340/870.02; 324/157; 340/870.05; 340/870.32; 346/14 MR
[58] Field of Search ............ 340/870.02, 870.03, 340/870.32, 870.05, 306; 346/14 MR; 324/157; 364/483; 179/82

[56] References Cited

U.S. PATENT DOCUMENTS

| | | | |
|---|---|---|---|
| 3,006,712 | 10/1961 | Eichacker | 346/14 |
| 3,748,654 | 7/1973 | Sutherland | 340/870.02 |
| 3,806,904 | 4/1974 | Weinberger et al. | 340/870.02 |
| 3,820,073 | 6/1974 | Vercellotti et al. | 340/870.02 |
| 3,872,455 | 3/1975 | Fuller et al. | 340/870.05 |
| 3,924,257 | 12/1975 | Roberts | 340/870.31 |
| 4,038,625 | 7/1977 | Tompkins et al. | 336/84.7 |
| 4,207,557 | 6/1980 | Gilkeson et al. | 364/483 |
| 4,253,192 | 2/1981 | Donnally et al. | 340/870.28 |
| 4,296,411 | 10/1981 | Romanelli et al. | 340/870.02 |
| 4,338,601 | 7/1982 | Nance-Kivell | 340/870.02 |

Primary Examiner—James J. Groody
Attorney, Agent, or Firm—Yount & Tarolli

[57] ABSTRACT

Method and apparatus are disclosed for communicating utility usage information from a utility usage location to a portable utility usage registering device (22). A utility usage detection circuit (10) is provided at the utility usage location. The circuit is connectable to a conventional utility meter (12), e.g., a natural gas meter, and provides an electrical signal indicative of utility usage. This signal is applied across a first inductive coil (23), which is mounted at the utility usage location such that the resulting magnetic field is accessible. A matching coil (36) is associated with the portable utility usage registering device and is housed such that it may be positioned within the magnetic field produced by the first inductive coil. When thus positioned the electrical signal produced by the circuit (10) is induced in the matching coil as a result of mutual inductance between the two coils. The electrical signal is thus communicated to the portable utility usage registering device without utilizing conventional electrical connectors, which are susceptible to corrosion, dirt contamination, etc.

19 Claims, 5 Drawing Figures

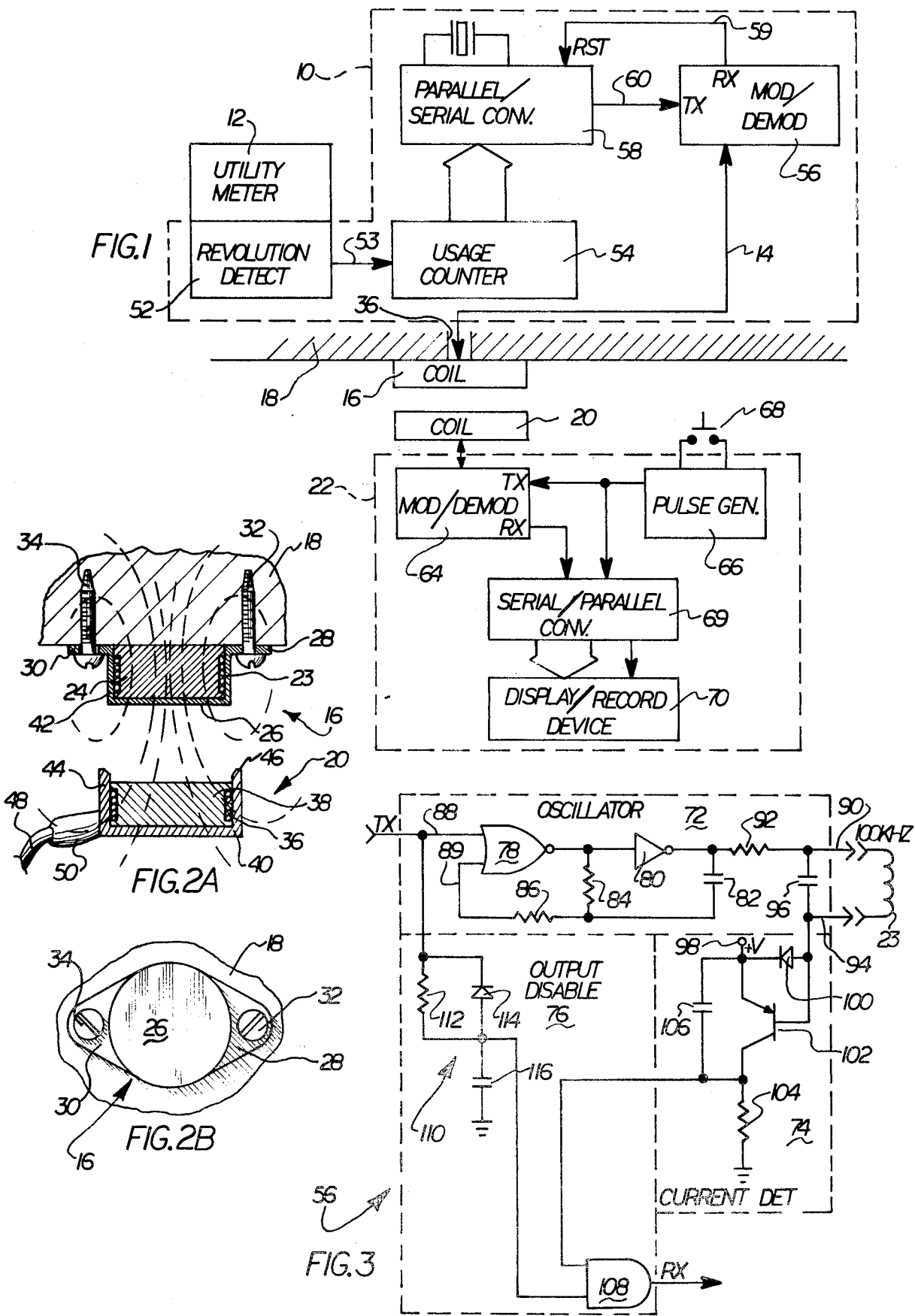

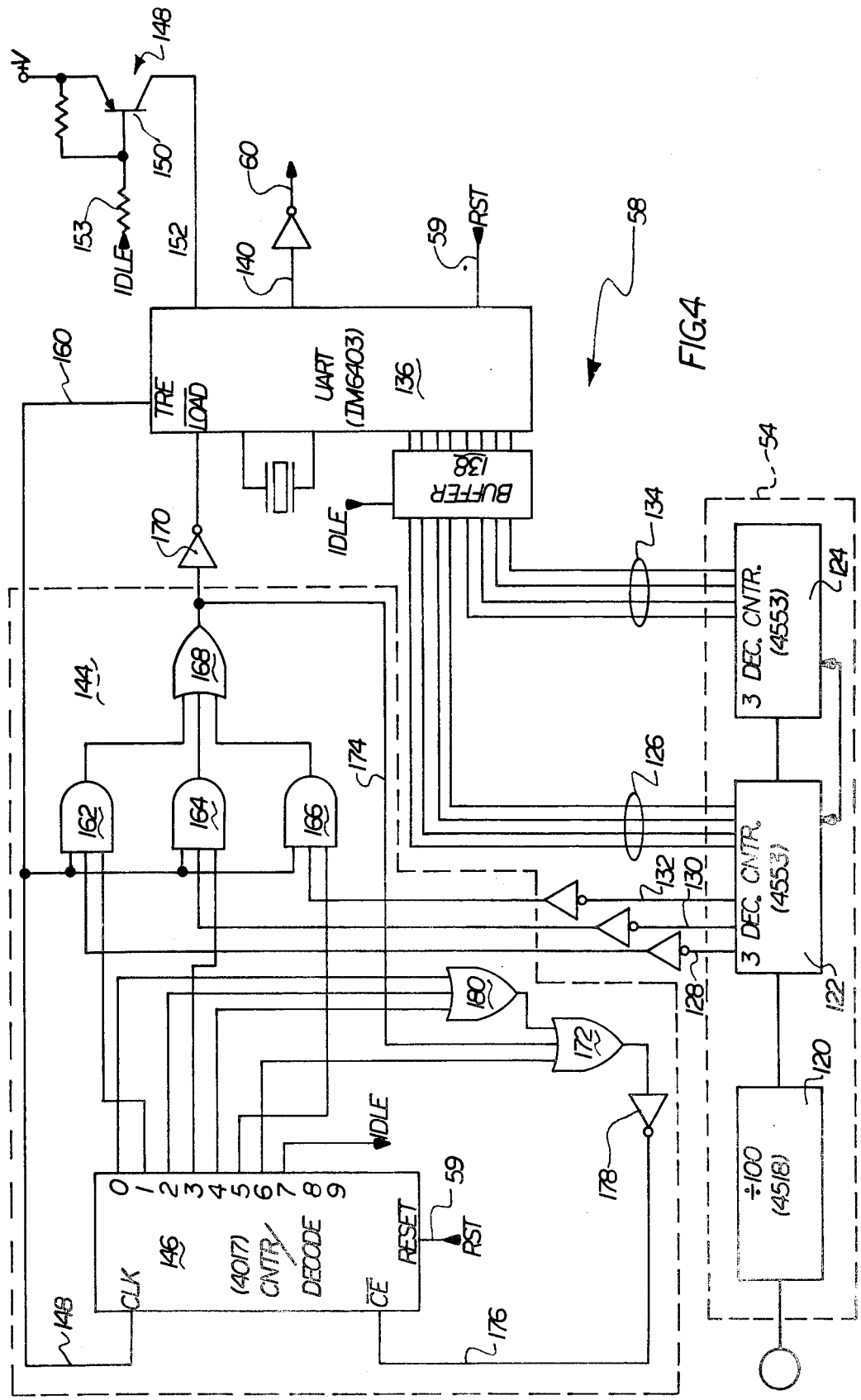

APPARATUS FOR COMMUNICATING UTILITY USAGE RELATED INFORMATION FROM A UTILITY USAGE LOCATION TO A PORTABLE UTILITY USAGE REGISTERING DEVICE

BACKGROUND AND FIELD OF THE INVENTION

The present invention relates to a utility usage registering system, and more particularly to a system wherein inductive coupling is used to communicate utility usage information from a utility usage location to a portable utility usage registering device carried from location to location.

Utility meters are used by utility companies to register the amount of energy, water, etc. consumed by residential and commercial users. These utility meters generally are mechanical devices having a meter face with a number of dials disposed thereon which register utility usage. Such utility meters, most notably gas meters, are generally located within the private dwellings of the residential customers and are therefore not readily accessible to utility company employees. The meter readings must be periodically taken, however, in order to determine the amount of utility usage and thus the appropriate bill to be forwarded to the customer.

It has long been recognized that it would be desirable if the utility meter were mounted outside of the dwelling, so that the utility meter reader would have continual access to the meter and the customer would be free of the obligation to admit strangers into their homes. Unfortunately, it would be prohibitively expensive to replace existing utility meters with other meters capable of being read from outside the customer's residence One other method of accomplishing the same goal would be to provide a retrofit device connectable to existing utility meters and designed to be read from outside of the customer's residence. In order to be successful, the retrofit device would have to be inexpensive to manufacture, simple to install and reliable in its operation.

Numerical displays tend to be rather expensive, and for this reason it would be desirable to avoid their use in any device for providing a utility reading outside of the customer's residence. One known manner of avoiding this is to simply provide a connector to which can be coupled a portable utility usage registering device carried by the meter reader. An electrical signal indicative of utility usage is then communicated directly to a portable recording device through a mating connector associated with the portable device. The patents to Sutherland, U.S. Pat. No. 3,748,654 and Eichacker, U.S. Pat. No. 3,006,712 both disclose systems wherein meter readings are communicated to a portable recording device through a connector mounted on the outside of a customer's dwelling. This approach not only eliminates the need for a numerical display on the outside of the customer's residence, but also eliminates transcribing errors which inevitably occur during human data entry operation. One problem with systems of this type is that the connectors used to couple the portable recording device to the meter are susceptible to corrosion, dirt, and mechanical breakage.

Other means of coupling the utility usage information to a remote utility usage registering device are also known. The patent to Ward et al., U.S. Pat. No. 4,213,119 discloses a system including an optical communications link between the customers house and the portable utility usage registering device. The patents to Long, U.S. Pat. No. 3,414,676 and Glidden, U.S. Pat. No. 3,390,234 disclose systems wherein the meter reading is communicated over pre-existing telephone lines to a remote central station. The patents to Simciak, U.S. Pat. No. 4,031,513 and Rouse, U.S. Pat. No. 3,688,271 disclose systems wherein a radio link is used to communicate the meter reading information from the customer's dwelling to the portable utility usage registering device. Although all three types of systems avoid the need for a connector mounted outside a customer's residence, they nonetheless suffer from their own unique problems. None has been found to be entirely satisfactory due to cost, performance, or both.

SUMMARY OF THE INVENTION

The present invention provides a system using an inductive, or transformer-like, coupling for communicating utility usage information from a utility usage location (e.g., at a residential customer's house) to a portable utility usage registering device carried from location to location. A device providing an electrical signal indicative of utility usage is installed at the utility usage location. This electrical signal is applied across a coil which is mounted in such a location (usually on the outside of the customer's house) that the magnetic field produced by the coil in response to the electrical signal is readily accessible. The portable utility usage registering device carried by the meter reader includes a matching coil which can be placed within this magnetic field so that the electrical signal is induced across it due to mutual inductance between the two coils. The electrical signal is thus communicated from the electrical device at the utility usage location to the portable utility usage registering device without need for a direct mechanical connection. The inductive coupling method is reliable since there are no exposed contacts subject to corrosion and dirt contamination, and is yet inexpensive to implement. Furthermore, since the coil associated with the usage location is close coupled to the coil associated with the portable utility usage registering device during the reading process, signal propagation problems such as are common in RF and optical links are avoided.

BRIEF DESCRIPTION OF THE DRAWINGS

The foregoing and other objects and advantages of the present invention will become more readily apparent from the following detailed description, as taken in conjunction with the accompanying drawings, wherein:

FIG. 1 is a broad block diagram of a utility meter reading system employing the present invention;

FIG. 2A is a more detailed cross sectional view of the coil assemblies used in the system of FIG. 1;

FIG. 2B is a plan view of the coil assembly mounted on the customer's house;

FIG. 3 is a detailed circuit schematic illustrating one specific embodiment of the modulator/demodulator blocks of FIG. 1; and FIG. 4 is a detailed circuit schematic of one form which the parallel/serial converter of the FIG. 1 embodiment may take.

DETAILED DESCRIPTION

FIG. 1 illustrates in block diagram form one embodiment of a utility meter reading system incorporating the concepts of the present invention. In this embodiment, the utility meter reading system is shown as including a battery powered retrofit device 10 which is connectable to an existing utility meter 12 located, for example, within a residential customer's house and therefore not readily accessible to utility company employees seeking to take its reading. The retrofit device 10 connects to the utility meter and converts the utility meter reading into an electrical signal indicative of utility usage. This electrical signal is then communicated over electrical conductors 14 to a coil assembly 16 which is shown in FIG. 1 as mounted on an exterior face 18 of the customer's house. The electrical signal, which is preferably a modulated carrier signal, is thereby applied across the coil associated with assembly 16, generating a changing magnetic field around the coil. The coil assembly 16 is configured and mounted so that this magnetic field is accessible from outside the house. Consequently, a matching coil assembly 20 associated with a portable utility usage registering device 22 can be placed within the magnetic field, whereby an electrical signal corresponding to the electrical signal provided by the circuitry 10 is induced across the coil associated with assembly 20. The electrical signal indicative of utility usage is thus communicated to the portable utility usage registering device 22 without any direct mechanical contact having been established between the portable unit 22 and the circuitry 10 installed within the customer's house.

FIGS. 2A and 2B illustrate one form which the coil assemblies 16 and 20 may take. FIG. 2A is a cross sectional elevation view of the coil assemblies 16 and 20. As can best be seen in FIG. 2A, coil assembly 16 includes a coil 23 wound on a generally cylindrical spool 24. The spool and coil assembly may have a diameter of, for example, one inch and may include on the order of 500 turns of coil wire. The resulting coil has an inductance of approximately 100 micro Henrys.

The spool 24 and coil 16 are covered by a cap 26 having a shape conforming to the shape of the coil and spool assembly. The spool 24 and cap 26 are glued or otherwise fastened together so as to provide a hermetically sealed enclosure for the coil 16. Mounting flanges 28 and 30 project from the cylindrical sidewall 42 of the cap 26, whereby the assembly 16 can conveniently be mounted to the outside of a house, for example, by mounting screws 32 and 34. The two wires representing the ends of the coil 23 (not shown in FIGS. 2A and 2B) protrude through the back of the coil assembly and pass through an opening 36 indicated schematically in FIG. 1. Preferably, this opening 36 will be located directly behind the spool assembly, and will be sealed with a suitable sealing compound.

The coil assembly 20 is similar in many respects to the coil assembly 16. The coil assembly 20 includes a coil 36 wound on a spool 38 and covered by a cap 40. In this case, however, the cylindrical side wall 44 of the cap projects somewhat beyond the spool 38 so as to provide an annular lip 46 which is useful in positioning the coil assembly 20 relative to the coil assembly 16. The inside diameter of the annular lip 46 is only slightly larger than the outside diameter of the cylindrical side wall 42 of the cap 26. The ends of the coil 36 are connected to a two-conductor wire 48 which passes through a sleeve 50 and then through the cylindrical side wall 44 of the cap 40.

The coil assembly 20 is of dimensions comparable to those of coil assembly 16 and may be readily carried in one hand by the meter reader. During the meter reading process, the coil assembly 20 is positioned over the coil assembly 16 such that the lip 46 engages the peripheral side wall 42 of the cap 26 associated with the coil assembly 16. When thus positioned, the two coils 23 and 36 are aligned in a coaxial relationship and are close enough to one another that any flux generated be coil 23 also passes through coil 36, and vice versa. Stated differently, the magnetic field produced by the coil 23 in response to the electrical signal appearing on line 14 also passes through the coil 36 whereby the mutual inductance of the two coils causes an induced voltage across the coil 36 which corresponds with the electrical signal applied to the coil 23. Thus, electrical signals can be communicated between the coils 23 and 36 by a transformer-like coupling, rather than through a direct connection.

The spools 24 and 38 upon which coils 23 and 36 are wound may be formed of any suitable material, such as a conventional plastic or phenolic material. Ferrite need not be employed although its use may be desirable in circumstances in which the two coil assemblies 16 and 20 may not be brought into abutment with one another. This may occur, for example, wherein the coil assembly 16 is not mounted outside of the house but is instead mounted on the inside surface of a window. In this case, the two coil assemblies will be separated by the thickness of the glass pane, whereby it will be desirable to form the spools of ferrite in order to extend the range of the magnetic fields generated by the coil assemblies 16 and 20.

The circuitry 10 which generates the electrical signal indicative of utility usage includes a revolution detector 52. The revolution detector is attached to the utility meter 12 and provides one pulse at its output 53 for each revolution of a selected dial on the dial face of the meter 12. This revolution detector may, for example, comprise a trip device such as disclosed in my co-pending application Ser. No. 311,531, filed Oct. 15, 1981, the contents of which are hereby incorporated herein by reference. The pulses provided by the revolution detector 52 are accumulated by a usage counter 54. In the embodiment presently being described the usage counter comprises six decades of binary-coded-decimal (BCD) digital counters such that a very large number of revolutions can be counted without the usage counter overflowing. The amount of utility usage is determined by taking consecutive readings of the usage counter 64 and subtracting the two readings.

The circuitry 10 includes a modulator/demodulator 56 and a parallel/serial converter 58 for transmitting the reading of the usage counter 54. The parallel/serial converter 58 converts the parallel digital reading provided by usage counter 54 into a serial bit stream. The modulator/demodulator amplitude modulates a carrier signal in accordance with the bit stream, and applies the resulting modulated carrier to the coil assembly 16. The modulator/demodulator 56 also demodulates carrier signals induced in the coil assembly 16 by coil assembly 20. The circuitry 10 is triggered by an interrogation pulse transmitted to the circuitry 10 from the portable device 22. The interrogation pulse, which is actually a burst of a carrier signal, is detected by the modulator/demodulator 56 associated with the unit 10. The modulator/demodulator 56 demodulates the interrogation pulse to provide a reset signal which is applied to the parallel/serial converter 58 on a reset line 59. At the conclusion of the interrogation pulse, the parallel/serial converter 58 reads the contents of the usage counter 54 as a parallel digital word, and shifts the digital word into the modulator/demodulator 56 serially. The first bit shifted into the modulator/demodulator 56 will be a logic "1" since the first parallel input of the parallel/serial converter 58 is preferably "tied high" to insure that the first bit of the serial binary word (referred to as a "start" bit) can be detected by the portable unit 22.

The modulator/demodulator 56 includes a carrier oscillator which is keyed by the signal applied to the "transmit" (TX) input 60 thereof. Thus, each time a binary "1" is applied to the TX input 60 of the modulator/demodulator 56, the modulator/demodulator applies a carrier signal to the coil assembly 16. When a binary "0" is applied to the TX input 60 of the modulator/demodulator 56, on the other hand, the oscillator is disabled whereby no signal is applied to the coil assembly 16. Thus, a series of carrier pulses are applied to the coil assembly 16 where the presence or absence of the carrier indicates the current logic value of the serial stream of binary bits being transmitted.

The portable utility usage register device 22 includes a modulator/demodulator 64 which is substantially identical to the modulator/demodulator 56 associated with the electrical signal generating apparatus 10. The TX input of the modulator/demodulator 64 is connected by a line 67 to a pulse generator 66 which provides an electrical pulse on the line 67 upon each closure of a mechanical switch 68. Each pulse momentarily keys the carrier oscillator associated with the modulator/demodulator 64, thereby producing an interrogation pulse. Thus, the operator can initiate an interrogation pulse by depressing and releasing the switch 68. The modulator/demodulator 64 also functions to demodulate the series of carrier pulses induced in coil 36 by the coil 23 and therefore recover the serial stream of binary bits being communicated from the circuitry 10.

Each pulse also resets a serial/parallel converter 68 whose serial input is connected to the "receive" (RX) output of the modulator/demodulator 64. The converter 68 may take any conventional form and may, for example, be a conventional universal asynchronous receiver/transmitter (UART). The serial/parallel converter 68 converts the serial stream of binary bits being provided at the RX output of the modulator/demodulator 64 into a parallel digital word once again. The parallel word is then loaded into a display/recording device 70 which may take any conventional form. The display/recording device 70 may include a numerical display for displaying the meter reading to the operator, a solid state memory, a paper tape printout, a magnetic tape recording device, or even a radio transmitter for relaying the information to a distant point. The patents to Etter, U.S. Pat. No. 4,133,034 and Reed et al., U.S. Pat. No. 4,169,290 disclose portable utility meter data recording and display devices.

FIG. 3 illustrates one possible embodiment for the modulator/demodulators 56 and 64 of the FIG. 1 embodiment. In FIG. 3, the modulator/demodulator 56 is shown as comprising three components: an oscillator 72, a current detector 74, and an output disable circuit 76.

The oscillator 72 includes a logic NOR gate 78, an inverter 80, and a feedback network including a capacitor 82 and two resistors 84 and 86. These components cooperate to provide a phase shift oscillator. This oscillator operates in a conventional manner and will not be described in detail for this reason.

The oscillator can be keyed by applying a low logic level signal to the input 88 of NOR gate 78. The output of NOR gate 78 will then be dependent upon the logic level of the feedback signal applied to the other NOR gate input 89. The input signal at input 98, however, shifts from one logic level to the other as the capacitor 82 alternately charges and discharges through the resistor 84. The net result is that the circuit oscillates. The output of the inverter 80 is then an AC signal having a frequency which is dependent upon the values of the components 82 and 84. This frequency may, for example, be approximately 100 kHz. The oscillator 72 will not oscillate when a high logic level signal is applied to the input 88 of NOR gate 78, since in this case the output of inverter 80 will be a low logic level signal regardless of the feedback signal. Thus, the oscillator can be keyed by providing a low logic level signal to the input line 88 of the NOR gate 78, and disabled by applying a high logic level signal to input line 88.

Input line 88 represents the TX input of the modulator/demodulator circuit 56. The output of the inverter 80 represents the output of the oscillator, and is supplied to one lead 90 of the coil 23 through a current limiting resistor 92. The opposite lead 94 of the coil 23 is connected to a +V supply through a diode/transistor combination forming part of the current detector 74. For present purposes, the lead 94 may be considered to be directly connected to the +V supply. A capacitor 96 is connected in parallel with the coil 23 so as to form a tank circuit which is at resonant the operating frequency of the oscillator.

As stated above, the current detector 74 includes a diode/transistor combination coupled between a +V supply terminal 98 and the terminal 94 of the coil 23. The purpose of this arrangement is to detect when current is flowing from the supply line to the coil 23. This occurs when a carrier signal is applied to the coil 23, whether due to an interrogation pulse being induced in the coil 23 or to the oscillator 72 being keyed. The diode/transistor combination includes a diode 100 and a PNP transistor 102, wherein the diode is connected across the base-emitter junction of the transistor. The emitter of transistor 102 is connected to the +V supply terminal 98 whereas the base of transistor 102 is connected to the terminal 94 of the coil 23. The diode 100 and base-emitter junction of the transistor 102 are connected anti-parallel. The diode-transistor combination therefore conducts current in both directions whereby it does not substantially impair the current flow between the coil 23 and the terminal 98.

When a carrier signal appears across coil 23, current will flow from the terminal 98 to the coil 23. This current flows through the base-emitter junction of transistor 102 on negative half cycles of the carrier signal, thereby periodically turning on the transistor. The transistor 102 has a load resistor 104 connected between its collector and ground. When the transistor 102 is turned on a positive voltage is developed across the resistor 104. A capacitor 106 is connected between the supply terminal 98 and the collector of the transistor 102 for filtering the voltage appearing across the load resistor 104. Since a positive voltage will appear across the load resistor 104 when the transistor 102 is turned on, and since the transistor 102 is turned on when an oscillating signal is being applied across the coil 23, it follows that the positive voltage appearing across the resistor 104 indicates that this oscillating signal exists. When a carrier signal is being applied across coil 23, a high logic level signal appears across resistor 104. When no carrier signal is being applied across coil 23, a low logic level signal appears across resistor 104. The current detector may therefore be used to detect and demodulate the interrogation signal applied to the coil 23.

The transistor 102 of the current detector 74 is turned on not only when the interrogation signal is being applied to the coil 23, but also when the oscillator 72 is keyed. The output disable circuit 76 is included to disable the output of the current detector 74 when the oscillator 72 is keyed since it is desired to provide a signal which indicates only those signals induced in the coil 23 by the coil assembly 20. The output disable circuit includes a two input AND gate 108 having one input thereof connected to the collector of the transistor 102. The second input of the AND gate 108 is a gating input which disables the AND gate 108 when the oscillator is keyed. The second input is connected to the keying input line 88 through an attack/release circuit 110 characterized by a fast attack and a slow release.

The circuit 110 includes a parallel combination of a resistor 112 and diode 114, connected in series with a capacitor 116 across the keying control line 88. When the keying control line 88 drops to a low logic level in order to enable the oscillator 72, the diode 114 becomes forward biased. The capacitor 116 is then rapidly discharged through the diode. When the keying control line 88 returns to a high logic level to thereby disable the oscillator 72, however, the diode 114 becomes reverse biased. The capacitor 116 must therefore recharge through the resistor 112. Thus, the AND gate 108 is disabled very rapidly when the oscillator is first keyed, but is re-enabled only after a short delay introduced by the charging of the capacitor 116, once the oscillator 72 is released. A slow release is included since ringing persists in the coil 23 for a brief period of time after the oscillator 72 is released whereby the output of the current detector remains high briefly. If the AND gate 108 were enabled immediately upon the release of the oscillator 72, this ringing would cause a reset pulse which would reset the circuitry 10 of FIG. 1. When configured as described, however, the output of AND gate 108 will be a high logic level signal when a carrier signal is being induced in the coil 23 and will be a low logic signal otherwise.

FIG. 4 is a more detailed circuit schematic of the circuitry 10 illustrated broadly in FIG. 1. In this Figure the usage counter 54 takes the form of three integrated circuits connected in cascade with one another. A prescaler circuit 120 divides the number of pulses provided by the revolution detector 52 by one hundred. The remaining two integrated circuits 122 and 124 are each three decade, binary coded decimal (BCD) counters connected in cascade. These two integrated circuits can thereby provide a total count having a value from 0 to 999,999. This accumulated count is more than adequate for purposes of the present invention.

Each of the three decades internal to integrated circuit 122 provides four output lines upon which appears a four bit BCD number representing one digit of the total count. Since integrated circuit 122 includes three counters, there are a total of 12 output lines from the counters. To reduce the number of output pins required by the integrated circuit, the integrated circuit 122 includes internal multiplexing circuitry for selectively connecting the outputs of any one of the three decades to four integrated circuit output lines 126. The integrated circuit 122 also includes internal clocking circuitry for causing the multiplexor to cycle so that the integrated circuit output lines 126 are connected to each of the three decades of counters in sequence. Consequently the least significant digit, second least significant digit, and most significant digit appear on the output lines 126, one after the other.

The counter 122 provides three other output lines 128, 130 and 132 upon which pulses appear for the purpose of strobing the digital data provided on the lines 126 into external device. A data strobe pulse appears on the output line 128 when the least significant digit is being provided upon the output lines 126. Similarly, a data strobe is applied on the output line 130 when the second least significant digit is being provided upon the output line 126, and a data strobe pulse is applied upon the output line 132 when the most significant digit is being provided upon the output lines 126. Since the digits are being provided upon the output lines 126 in a continuous sequence, data strobe pulses will sequentially appear on the output lines 128, 130 and 132.

The three decade BCD counter 124 is the same as the three decade BCD counter 122, and is coupled to it so that its associated three digits are provided on its associated output lines 134 in the same sequence as are the three digits of decade counter 122. For example, when the BCD counter 122 is providing its least significant digit on the output lines 126, the BCD counter 124 is providing its least significant digit on the output lines 134. The data strobe pulses occurring on the output lines 128, 130 and 132 of counter 122 therefore also indicate which digit is being provided upon the output lines 134 of the BCD counter 124.

The four bits provided on the output lines 126 and the four bits provided on lines 134 together represent an eight bit byte which is transferred into a universal asynchronous receiver/transmitter (UART) 136 upon the occurrence of each data strobe pulse. The UART 136 adds start and stop bits to the byte of data, and then transmits it serially along an output line 140. The timing of the operations performed by the UART 136 is controlled by clock signals generated internally by the UART with the help of an external crystal 142.

The UART 136 is controlled by a controller 144. The function of the controller 144 is to sequentially load three bytes into the UART 136 (representing the six digits stored within the BCD counters 122 and 124) each time a reset pulse is received from the modulator/demodulator circuitry described previously with respect to FIG. 3. The controller 144 includes a counter/decoder 146 for controlling the sequence of operations to be performed. The counter/decoder 146 contains a one decade BCD counter together with decoding circuitry for providing a decoded output upon ten output lines carrying numerical designations of 0 through 9.

At any given time a high logic level signal will be provided upon one and only one of these output lines. The particular one of the output lines upon which a high logic level signal appears will depend upon to the count contained within the internal counter. For example, when the counter contains a count of five the output line carrying the numerical designation 5 will be at a high logic level. Each time a clock pulse is applied to the counter/decoder 146 upon its clock input 148, the internal BCD counter will increment its count by a value of one and the high logic level signal will switch to the output line having the next higher numeric designation.

Normally (i.e., except when responding to an interrogation pulse provided by the portable utility usage device) the BCD counter within counter/decoder 146 contains a count of seven, whereby its "7" output line is at a high logic level and the remaining output lines are low. This output line is identified as the "idle" output line in FIG. 4. The idle signal is applied to a buffer 138 which buffers the parallel input to the UART 136, and also to a power control circuit 148 which controls the supply of power to the UART. The purpose of these two elements is to remove power from the UART 136 except when responding to an interrogation pulse. This is desirable since it reduces power consumption, thereby lengthening the life of the battery used to power the circuitry 10.

The power control circuit 148 includes a PNP transistor 150 having its emitter connected to a +V supply and its collector connected to the power supply input 152 of the UART 136. The base of the transistor 150 is connected to the idle output of counter/decoder 146 through a suitable current limiting resistor 153. When the idle line is at a high logic level the base-emitter junction of the transistor 150 is reverse biased and the transistor is cut off. In this case no power is applied to the UART 136. When the idle line is at a low logic level, however, current will be pulled through the base-emitter junction of the transistor 150, forcing it into saturation whereby power is supplied to the UART 136. Since the idle line is normally at a high logic level, power is normally disconnected from the UART 136.

The buffer 138 is included between the outputs of the counters 122 and 124 and the parallel data input of the UART 136 since it has been found that the UART 136 draws power from the outputs of the counters 122 and 124 even when power is removed from the UART 136, itself. The buffer 138 is a conventional three state digital circuit which effectively couples the output of the counters 122 and 124 to the input of the UART 136 as long as its control line (which is connected to the idle output of counter/decoder 146) is at a low logic level. When its control line shifts to a high logic level, however, the buffer 138 essentially disconnects the counters 122 and 124 from the UART 136, thereby preventing loading of the counter outputs.

When an interrogation carrier pulse is received by the modulator/demodulator 56 (FIG. 1) a positive-going reset pulse is generated thereby which is applied to the reset inputs of the counter/decoder 146 and the UART 136. Immediately upon receipt of the reset pulse, the counter/decoder 146 resets its internal counter to a zero state. The idle line thus drops low and the "0" output line shifts to a high logic level. As soon as the idle line drops low, power is applied to the UART 136 and it responds to the reset pulse by resetting all internal counters, etc. to initial values. During the reset operation, an output line 160 of the UART 136, which normally indicates when the UART 136 has completed transmission of a byte, is forced into a low logic level. This output line 160 (also referred to as the TRE line, i.e., transmitter empty) will shift back to a high logic level shortly after the conclusion of the reset pulse. The TRE output line 160 of the UART 136 is connected to the clock input 148 of the counter 146 whereby the counter 146, if enabled in a fashion to be described hereinafter, is incremented each time the output line 160 of the UART 136 is at a high logic level.

After being reset to its "0" state, the counter/decoder 146 is sequentially clocked through states 0-7 in order to control the application of load pulses to the UART 136. The outputs of the counter/decoder 146 control the enablement of three AND gates 162, 164 and 166. Each of the data strobe lines 128, 130 and 132 of the BCD counter 122 is connected to an input of a corresponding one of these three AND gates 162, 164 and 166. As the counter/decoder 146 sequentially steps through its states, each of the AND gates is enabled to pass one and only one of the data strobe pulses on its corresponding data strobe input. The outputs of the three AND gates 162, 164 and 166 are joined by an OR gate 168 whose output is applied to the LOAD input of UART 136 through a logic inverter 170. By this arrangement, each time a data strobe pulse is provided at the output of one of these AND gates, a LOAD signal is applied to the UART 136. The UART 136 responds to the LOAD command by loading the byte then appearing at its parallel inputs. As mentioned previously, this byte includes one digit from counter 122 and one digit from counter 124. Since each of the three data strobe pulses provided by counter 122 is used to load the UART 136 only once, all three decades of each of the counters 122 and 124 are loaded into the UART 136 and transmitted serially thereby along its output 140.

More specifically, upon being reset by the reset pulse, the counter/decoder will be in its "0" state. Shortly after the reset pulse the TRE output 160 of the UART 136 will shift to a high logic level, thereby clocking the counter/decoder 146 into its "1" state. This enables AND gate 162, whereby the next data strobe pulse appearing on line 128 of counter 122 will be enabled to pass through the LOAD input of the UART 136. The least significant digits of counters 122 and 124 are thus loaded into the UART and transmitted thereby.

The load pulse also causes the counter/decoder 146 to be advanced to its "2" state, since the output of OR gate 168 is connected to one input of an OR gate 172 by a line 174, and since the output of OR gate 172 is applied to the clock enable input 176 of counter/decoder 146 through a logic inverter 178. Each load pulse provided at the output of OR gate 168 therefore causes the counter/decoder to be momentarily enabled. Since the clock input to counter/decoder 146 is still at a high logic level at this time, this causes the counter/decoder to be advanced to the "2" state, as mentioned previously. The clock input 148 then shifts to a low logic level since it is derived from the TRE output of UART 136, and the TRE output switches to a low logic level after a LOAD pulse. When the TRE output of UART 136 returns to a high logic level upon the conclusion of transmission of the newly loaded digital byte, the clock 146 is advanced into the "3" state. (It will be noted that the counter/decoder 146 is continually enabled whenever the counter/decoder is in an even state, since the even outputs of counter/decoder 146 are joined together by OR gate 180, whose output is applied to one input of OR gate 172.)

When the counter/decoder 146 is in state "3", AND gate 164 is enabled whereby the next strobe pulse appearing on data strobe line 130 will cause the loading of the second least significant digits into the UART 136 and the advancement of the counter/decoder 146 into the "4" state. After the UART 136 has completed transmission of these two digits, the TRE line 160 will return to a high logic level. This clocks the counter/decoder 146 into a "5" state wherein the AND gate 166 is enabled. AND gate 166 therefore permits the next data strobe pulse appearing on the data strobe line 132 to pass to the LOAD input of the UART 136, and to clock the counter/decoder 146 into its "6" state. The UART 136 transmits the most significant digits thus loaded into the UART, and thereafter clocks the counter/decoder 146 into its "7" state. As mentioned previously, when the counter/decoder is in its "7", or idle, state power is removed from the UART 136 and the buffer 138 is disabled, disconnecting the counters 122 and 124 from the UART 136.

Although the invention has been described with respect to a preferred embodiment, it will be appreciated that various rearrangements and alterations of the parts may be made without departing from the spirit and scope of the present invention, as defined in the appended claims.

What is claimed is:

1. Apparatus for communicating information relating to utility usage at a utility usage location to a portable utility usage registering device, comprising means for, when enabled, providing an electrical signal indicative of utility usage, an inductive coil adapted to receive said electrical signal indicative of utility usage for providing a localized magnetic field which changes in accordance therewith, whereby a portable magnetic field detector associated with said portable utility usage registering device may be disposed within said field so as to detect said magnetic field and thus receive information relating to utility usage, and means for enabling said electrical signal providing means in response to a signal induced in said inductive coil by said portable utility usage registering device.

2. Apparatus as set forth in claim 1, and further comprising coil housing means for housing said inductive coil such that said magnetic field is accessible, said housing means providing a hermetically sealed enclosure for said coil when mounted on a surface exposed to the weather.

3. Apparatus as set forth in claim 1, wherein said means for providing said electrical signal comprises digital means for generating a digital signal indicative of utility usage, and modulator means for modulating a carrier signal in accordance with said digital signal to provide a modulated carrier signal serving as said electrical signal indicative of utility usage.

4. Apparatus as set forth in claim 1, wherein said means for providing said electrical signal comprises first means for generating a parallel multibit digital word indicative of utility usage, parallel to serial converter means for converting said parallel word into a serial bit stream, and modulator means for modulating a carrier signal in accordance with said serial bit stream to provide a modulated carrier signal serving as said electrical signal indicative of utility usage.

5. Apparatus as set forth in claim 4, wherein said parallel to serial converter means is responsive to a reset signal and converts said parallel word into a serial bit stream each time said reset signal occurs, and further wherein said enabling means includes means for providing said reset signal in response to said signal induced in said inductive coil by said portable utility usage registering device.

6. Apparatus as set forth in claim 5 for use in a system wherein said portable utility usage registering device provides an electromagnetic interrogation indication when said portable magnetic field detector associated with said portable utility usage registering device is positioned to detect the magnetic field produced by said inductive coil and is thus prepared to receive said information relating to utility usage, and wherein said enabling means comprises means for providing said reset signal in response to receipt of said interrogation indication by said inductive coil.

7. Apparatus as set forth in claim 4, wherein said modulator means comprises means for amplitude modulating said carrier signal in accordance with said serial bit stream.

8. Apparatus as set forth in claim 7, wherein said amplitude modulator means comprises oscillator means for providing a carrier signal when said serial bit stream has a first logic value and no carrier signal when it has a second logic value.

9. Apparatus as set forth in claim 7, wherein said amplitude modulator means comprises oscillator means having an input and an output, said oscillator means being responsive to the logic value of an input signal applied to said input for providing a carrier signal on said output only when said input signal has a first logic value, and means for applying said serial bit stream to said oscillator input whereby said oscillator provides an output signal comprised of a carrier signal whose amplitude is modulated in accordance with said serial bit stream.

10. Apparatus as set forth in claim 4, wherein said first means comprises utility usage detector means for providing an indication each time an incremental amount of utility usage occurs, and counter means for counting said indications to provide a count signal representative of the cumultative number of said indications, said counter means providing at least part of said count signal as a parallel multibit digital word.

11. Apparatus as set forth in claim 10, wherein said means for providing said indication each time an incremental amount of utility usage occurs comprises revolution detector means connectable to a utility meter having a dial arm which rotates at a rate proportional to utility usage for providing an electrical pulse upon each full revolution of said dial arm, said electrical pulse being said indication.

12. Apparatus for communicating utility usage information to a portable utility usage registering device from a utility usage location, comprising an inductive coil adapted to be coupled to said portable utility usage registering device for providing thereto signals induced across said coil by externally applied magnetic fields, whereby said utility usage information may be communicated to said portable utility usage device by generating a magnetic field which changes in accordance with said information and disposing said inductive coil in said magnetic field, and further comprising means for applying a signal across said coil such that said coil generates its own magnetic field for notifying apparatus at said utility usage location that said portable utility usage registering device is prepared to receive said information.

13. Apparatus as set forth in claim 12, wherein said apparatus further comprises coil housing means for housing said inductive coil.

14. Apparatus as set forth in claim 12, adapted for use in a system wherein a modulated carrier signal is induced across said coil by said externally applied magnetic field, wherein said apparatus further comprises means for demodulating said modulated carrier signal so as to thereby recover said utility usage information.

15. Apparatus for communicating information relating to utility usage from a utility usage location to a portable utility usage registering device, comprising first means adapted to be installed at said utility usage location for generating a localized magnetic field which changes in a manner representative of utility usage information, and second means adapted to be coupled to and carried about with said portable utility usage registering device for being disposed within and detecting changes in said localized magnetic field generated by said first means, said second means thus detecting said utility usage information.

16. Apparatus as set forth in claim 15, wherein said first means includes a first inductive coil for generating said magnetic field and said second means includes a second inductive coil for detecting said magnetic field.

17. Apparatus as set forth in claim 16, wherein said first and second inductive coils are housed within first and second housings, respectively, said first and second housings being configured so that they can be mated to one another and that, when thus mated, said first and second coils are close coupled whereby magnetic fields generated by one of said coils will then induce signals in the other of said coils.

18. Apparatus as set forth in claims 17, wherein said first housing is hermetically sealed such that first coil is protected from ambient environmental conditions.

19. Apparatus for determining utility usage at a utility usage location, and for electrically communicating a related utility usage signal to a portable utility usage recording device carried from one utility usage location to another, comprising:
counter means responsive to utility usage for accumulating a count representative of total utility usage,
triggerable modulator means for, when triggered, modulating a carrier signal in accordance with said count,
coil means mountable in a readily accessible location and coupled to said modulator means for receiving said modulated carrier therefrom, said coil means providing a magnetic field which varies in accordance with said modulated carrier, said magnetic field being accessible such that a portable magnetic field responsive means associated with said portable utility usage recording device can be disposed within said magnetic field so as to receive said modulated carrier therefrom, and
receiver means responsive to signals magnetically induced in said coil means by said portable utility usage recording device for triggering said modulator means in response thereto.

* * * * *